United States Patent [19]

Heeren

[11] 4,034,242
[45] July 5, 1977

[54] LOGIC CIRCUITS AND ON-CHIP FOUR PHASE FET CLOCK GENERATOR MADE THEREFROM

[75] Inventor: Richard H. Heeren, Palatine, Ill.

[73] Assignee: Teletype Corporation, Skokie, Ill.

[22] Filed: Aug. 25, 1975

[21] Appl. No.: 607,408

[52] U.S. Cl. .............................. 307/269; 307/205; 307/208; 307/265

[51] Int. Cl.² .................. H03K 5/13; H03K 3/353; H03K 19/08; H03K 19/20

[58] Field of Search .......... 307/205, 208, 207, 215, 307/220 C, 221 C, 269, 265; 328/63

[56] References Cited

UNITED STATES PATENTS

| | | | |
|---|---|---|---|
| 3,365,707 | 1/1968 | Mayhew | 307/205 X |
| 3,395,291 | 7/1968 | Bogert | 307/208 X |
| 3,536,936 | 10/1970 | Rubinstein et al. | 307/269 |
| 3,564,299 | 2/1971 | Varadi | 307/208 X |
| 3,596,108 | 7/1971 | Heeren | 307/205 |
| 3,641,370 | 2/1972 | Heimbigner | 307/269 |
| 3,659,286 | 4/1972 | Perkins et al. | 307/269 X |
| 3,740,660 | 6/1973 | Davies, Jr. | 307/221 C X |

OTHER PUBLICATIONS

Chin et al., "Gated Inverter Using Complementary Metal-Oxide-Silicon Transistors;" vol. 16, No. 7, pp. 2289–2290; Dec. 1973.

Primary Examiner—John S. Heyman
Assistant Examiner—Larry N. Anagnos
Attorney, Agent, or Firm—W. G. Dosse; M. Pfeffer

[57] ABSTRACT

A phased, four-output clock generator implemented on-chip with MOSFETs, has two phased inputs $\phi_A$ and $\phi_B$ thereto. If $\phi_A$ and $\phi_B$ are properly time-phased (in sequence: $\phi_A=1$, $\phi_B=0$; $\phi_A=0$, $\phi_B=0$; $\phi_A=0$, $\phi_B=1$; and $\phi_A=0$, $\phi_B=0$) the four outputs are time phased as:

| | $\phi_1$ | $\phi_2$ | $\phi_3$ | $\phi_4$ |
|---|---|---|---|---|
| $t_1$ | 1 | 0 | 0 | 0 |
| $t_2$ | 0 | 1 | 0 | 0 |
| $t_3$ | 0 | 0 | 1 | 0 |
| $t_4$ | 0 | 0 | 0 | 1 |

The clock includes two timers each of which contains a phasing module and a NOR-gate. The phasing modules have two inputs A and B and produce an output as follows:

| A | B | Output |
|---|---|---|
| 0 | 0 | P |
| 0 | 1 | 0 |
| 1 | 0 | 1 |
| 1 | 1 | 0 | where "P" indicates that the last succeeding output is left unchanged or stretched. The NOR-gate inputs are respectively connected to their phasing module outputs and to the B input of their corresponding phasing module. $\phi_A$ is connected to the A input of the first timer and to B of the second; $\phi_B$ is complementarily connected. $\phi_1$ is derived from the A input of the first timer; $\phi_2$ from the second timer NOR output; $\phi_3$ from the B input of the first timer; and $\phi_4$ from the first timer NOR output.

16 Claims, 11 Drawing Figures

Fig. 1a
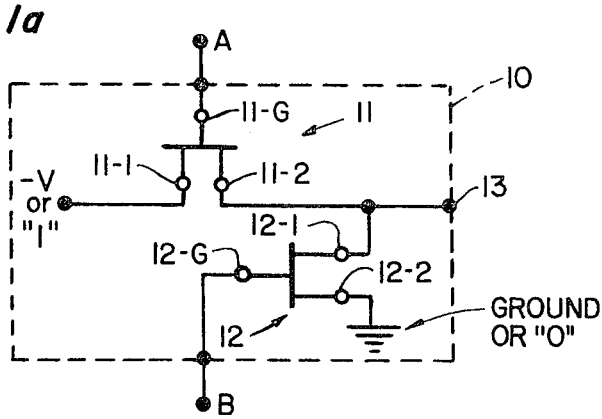
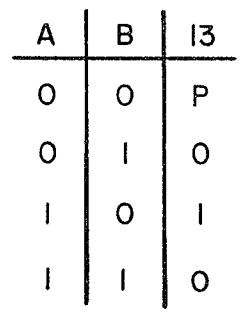
Fig. 1b
Fig. 2a
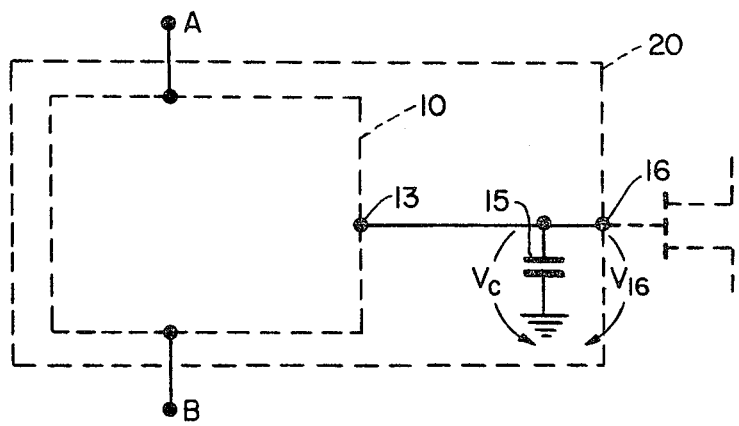
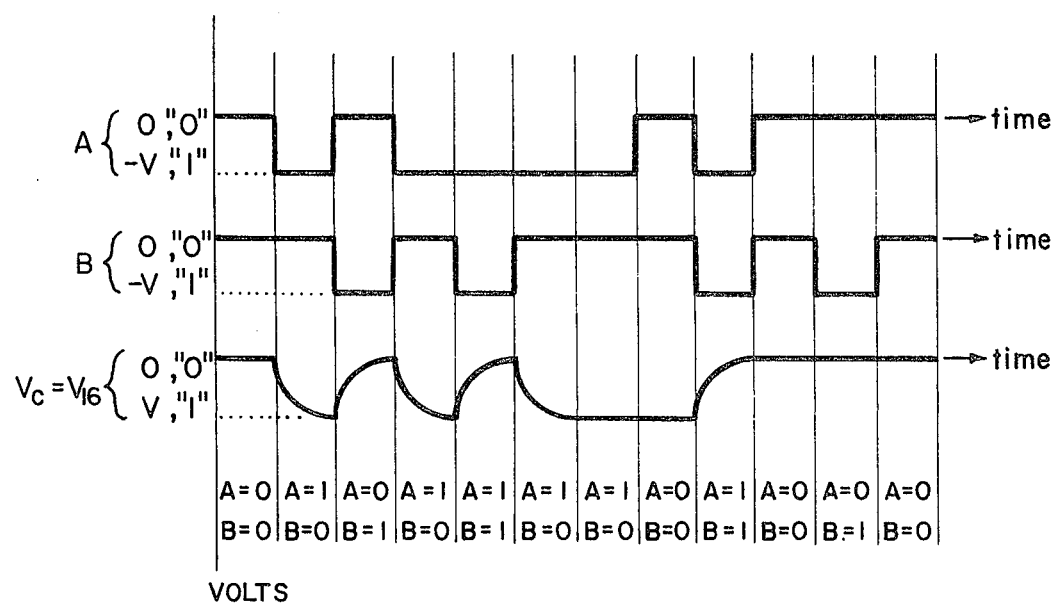
Fig. 2b

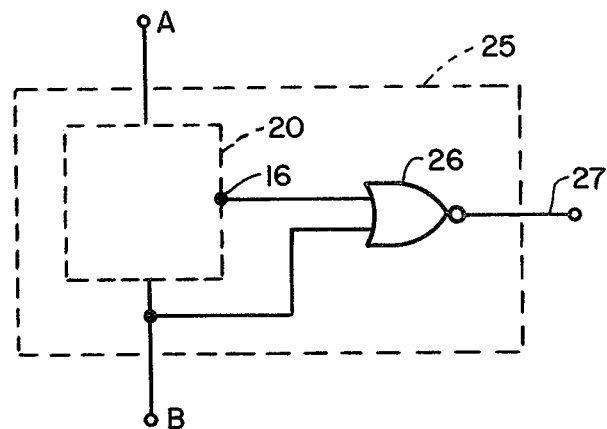
Fig. 2c
Fig. 2d
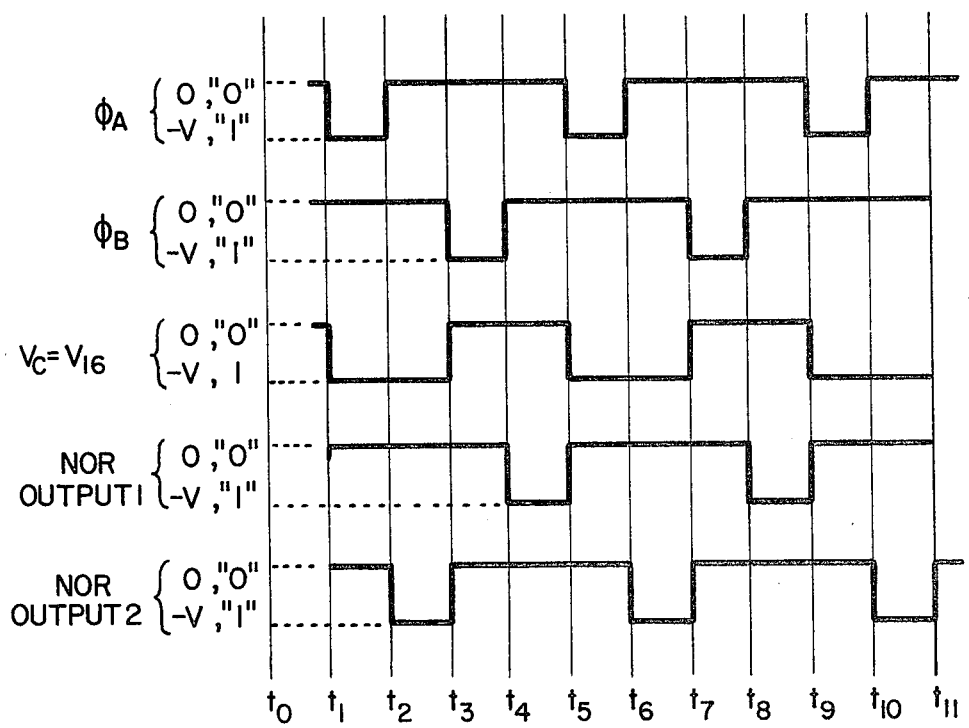
Fig. 2e

LOGIC CIRCUITS AND ON-CHIP FOUR PHASE FET CLOCK GENERATOR MADE THEREFROM

BACKGROUND OF THE INVENTION

The present invention relates to logic circuits and to clock generators made therefrom and, in particular, to MOS logic circuits and to MOS clock generators made therefrom, both being suitable for fabrication by integrated circuit (IC) techniques.

Existing integrated logic circuits often require a plurality of clock pulses having defined, predetermined phase relationships among themselves. Often these pulses are supplied by clocks, integrated or otherwise, external to the logic circuits which utilize them. The use of external clocks requires wire or the like interconnections which complicate manufacturing and increase the overall size of the logic circuits. Moreover, if the clocks are not implemented as IC's, the advantages inherent in IC usage are partly lost.

Also, many integrated clocks employ internal loads, thereby requiring that there be a bias current from a power supply. Energy from the power supply must be dissipated on the chip on which the clock resides, limiting packing density.

A specific object of this invention is, therefore, to provide FET logic circuits from which FET clocks may be formed entirely "on-chip" by MOS techniques, along with other circuits which utilize the clock's output.

A further object of this invention is the provision of such circuits and a clock using only FET gates wherein the only current required is that supplied to output loads driven by the clock, and wherein such output load current is supplied by inputs to the clock.

SUMMARY OF THE INVENTION

The foregoing and other objects of the invention are effected by the logic circuits of this invention which comprise a phasing module or pulse stretcher module. The module has a plurality of inputs, an output, and three modes of operation: First, if a logical signal of a first type (S) is applied to a selected input and a logical signal of a second type ($\overline{S}$) is applied to all of the other inputs, S appears on the output. Second, if any of the other inputs has a S thereon, regardless of the state of the selected input, $\overline{S}$ appears on the output. Third, if all of the inputs have $\overline{S}$ thereon, the output remains as it was from the last applied sequence of inputs, specifically, S if the last input sequence was as in the first mode or $\overline{S}$ if that sequence was as in the second mode. In effect, any previous S, or $\overline{S}$ output is stretched by a following "all $\overline{S}$" input. Alternatively, the output resulting from an "all $\overline{S}$" input may be deemed a quiescent or passive output, represented by "P".

The module of the present invention may be used to construct the clock of this invention. To the clock are fed at least two phased input pulses $\phi_A$ and $\phi_B$. The input pulses are phased so that the first, $\phi_A$, is S for a time $t_1-t_2$, and the second, $\phi_B$ is S from $t_3-t_4$, $\phi_A$ and $\phi_B$ being $\overline{S}$ during $t_2-t_3$, and during $t_4-t_5$. The next S value for $\phi_A$ is during $t_5-t_6$, etc. Three or more inputs would be similarly phased.

A first module, having inputs to match the number of inputs $\phi_A$ and $\phi_B$, has one input (the selected one) connected to $\phi_A$ and the other input to $\phi_B$. Thus, for $\phi_A=S$, $\phi_B=\overline{S}$, the output is S; for $\phi_A=S$, $\phi_B=S$ or $\phi_A=\overline{S}$, $\phi_B=S$, the output is $\overline{S}$; for $\phi_A=\overline{S}$, $\phi_B=\overline{S}$, the output is P, the passive, quiescent or stretching output. A second module is complementarily connected so that for $\phi_A=\overline{S}$, $\phi_B=S$, the output is S; for $\phi_A=S$, $\phi_B=\overline{S}$ or $\phi_A=S$, the output is $\overline{S}$; for $\phi_A=\overline{S}$, $\phi_B=\overline{S}$, the output is P.

Also included are timers, each of which comprises one phasing module and one logic gate. The logic gates are of a type having inputs to match the number of inputs $\phi_A$ and $\phi_B$. If all of the gate inputs are S, the output is S. If any input is S, the output is $\overline{S}$. The first logic gate has a first input connected to the output of the first module, and its other input connected to the non-selected input (or $\phi_B$) of the first module. The second logic gate has a first input connected to the output of the second module, and is other input connected to the non-selected input (or $\phi_A$) of the second module.

The output of the clock is four phased pulses $\phi_1-\phi_4$, wherein $\phi_1$ is S from $t_1-t_2$; $\phi_2$ is S from $t_2-t_3$; $\phi_3$ is S from $t_3-t_4$; $\phi_4$ is S from $t_4-t_5$; $\phi_1$ is S again from $t_5-t_6$; etc.

$\phi_1$ is $\phi_A$. $\phi_2$ is the output of the second logic gate. $\phi_3$ is $\phi_B$. $\phi_4$ is the output of the first logic gate.

The phasing of $\phi_1-\phi_4$ depends on the following: neither logic gate gives an output unless both inputs are $\overline{S}$. In the case of the first logic gate during $t_1-t_2$, $\phi_A=S$, $\phi_B=\overline{S}$; the output from the first module is S and the first logic gate gives no output, but $\phi_1=\phi_A$ and is S during this time. During $t_2-t_3$, $\phi_B$ remains $\overline{S}$ so that the S output of the first module which is stretched by $\phi_A=\phi_B=\overline{S}$ and is applied to the first input of its logic gate, prevents an output therefrom. From $t_3-t_4$, although the first module's output is S, $\phi_B$ (the second input of the first logic gate) is S; again, the first logic gate gives no output, but $\phi_3=\phi_B$ and is S during this time. From $t_4-t_5$ both $\phi_B=\overline{S}$ and the output from the first module is S. The first logic gate thus outputs an S which is $\phi_4$.

A similar analysis of the second logic gate shows that it will give an S output only from $t_2-t_3$ and thus is $\phi_2$.

The above analysis presumes that $\phi_A$ and $\phi_B$ are S while they persist. If $\phi_A$ and $\phi_B$ go from S to $\overline{S}$ while they persist, inverters are respectively connected between $\phi_A$ and the first input of the first module on the one hand, and between $\phi_B$ and the first input of the second module on the other hand, to yield $\phi_1-\phi_4$ as described above.

Preferably all of the elements of the clock including the modules, the logic gates and inverters are MOSFETs formed on the same chip during the same processing sequences by appropriate doping, photo-shaping and metal deposition steps.

Other objects of the invention will be apparent from the following detailed description when read with the appended drawings, in which:

BRIEF DESCRIPTION OF DRAWINGS

FIG. 1a is a circuit diagram of a MOSFET-implemented building block used in the present invention;

FIG. 1b is a truth table describing the function of the building block of FIG. 1a;

FIG. 2a is a circuit diagram of a phasing module or pulse stretcher of this invention formed by the building block of FIG. 1a operating into a capacitor as an output load;

FIG. 2b is a waveform of voltage and of logical state, both versus time, of an output taken across the capacitor of FIG. 2 for various inputs;

FIG. 2c is a circuit diagram of a timer made from the phasing module of FIG. 2a, according to this invention;

FIG. 2d is a truth table describing the operation of the timer of FIG. 2c for various inputs;

FIG. 2e is a timing diagram for the timer of FIG. 2c for specific phased inputs thereto;

FIG. 3b is a logical timing diagram of the clock of FIG. 3a;

DETAILED DESCRIPTION

General

Figure 4A:
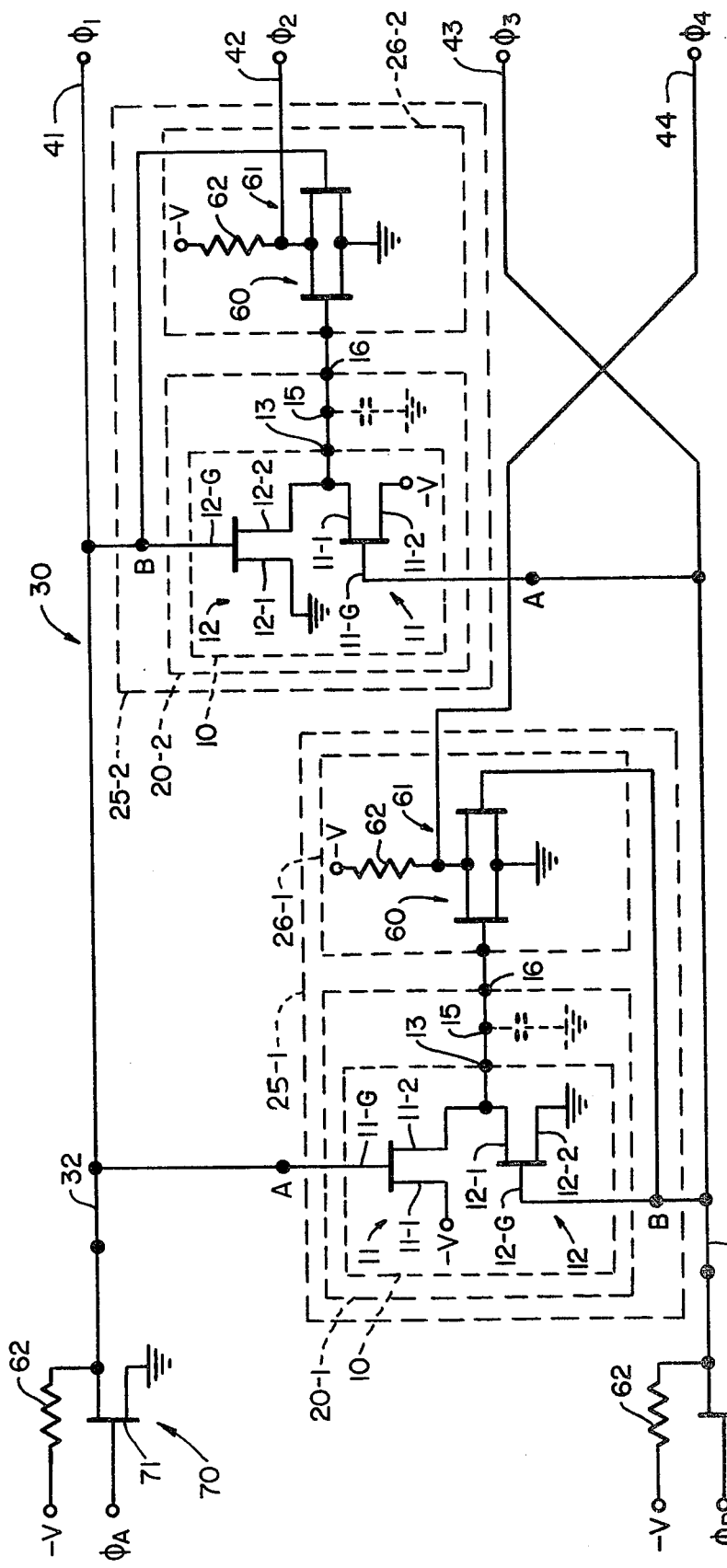
FIG. 4a is a second embodiment of the clock of the present invention as completely implemented on-chip with MOSFET devices.

FIGS. 1a and 4a show various features of the present invention using MOSFET devices. Specifically, the MOSFETs hereof are metal-oxide-semiconductor-field-effect-transistors manufactured as P-channel enhancement-mode devices by integrated circuit techniques. Each P-channel FET herein uses so-called negative logic; that is, a negative voltage voltage ($-V=1$) applied to its gate electrode "opens" the FET, i.e., induces a low impedance between the controlled terminals (source and drain) of the FET. A ground potential (0 volts = 0) applied to FET gate electrode "closes" the FET, i.e., induces a high impedance between the controlled terminals. Conveniently, as is well-known, one of the controlled electrodes may be connected to a 1 ($-V$) or to a 0 (0 volts). If the former, and the gate has a 1 ($-V$) thereon, the other controlled electrode has a 1 ($-V$) thereon. Similarly, if the first controlled electrode has a 0 and the gate has a 1, the other controlled electrode has a 0. In view of the negative logic terminology used herein a logical value of a first type of S, is conveniently designated as 1. A logical value of a second type, or $\bar{S}$, is conveniently designated 0. Thus $-V=S=1=$ first logical value and 0 volts$=\bar{S}=0=$ second logical value.

Of course S could designate 0 and $\bar{S}$ could be 1. Moreover, it should be understood that the principles of the invention apply equally to circuits using different types of FETs, e.g., N-channel. In the case of N-channel FETs, positive logic is used wherein $+V=1$ and 0 volts $= 0$, although, again, this terminology may be reversed.

BUILDING BLOCKS 10

FIG. 1a shows a logical building block 10 used in the present invention. The block 10 is disclosed in my U.S. Pat. No. 3,631,465.

The block 10 comprises a first FET 11 and a second FET 12. A first controlled terminal 11-1 of the FET 11 is connected to a signal S, which as explained shortly, is preferably $-V$ or 1. A second controlled terminal 11-2 of the FET 11 is connected to a first controlled terminal 12-1 of the FET 12 to form an output node 13. A second controlled terminal 12-2 of the FET 12 is preferably connected to a signal $\bar{S}$, preferably ground potential, i.e., 0 volts = 0.

The gates 11-G and 12-G of the FETs 11, 12 are connectible respectively to input signals A and B. The truth table in FIG. 1b describes the state of the input node 13 for various input pair A, B on the gates 11-G, 12-G.

Specifically, if A=0, B=0, neither the 1 on the terminal 11-1 nor the 0 on the terminal 12-2 can pass through the FETs 11, 12. The output node 13, thus remains passive or quiescent. This passive state, wherein the output node 13 can have no effect on subsequent circuitry connected to it, is designated by P. If A32 1, B=0, the gate 12 remains closed and the 1 on the terminal 11-1 passes through the FET 11 and is applied to the node 13. The node 13 is at the 1 state, which 1 will be applied to any subsequent circuitry as $-V$.

If A=0, B=1, the gate 11 is closed, but the gate 12 is opened, applying the 0 on the terminal 12-2 to the node 13, which 0 will cause subsequent circuitry connected to such node to be grounded. Thus, A=0, B=1, pulls the node 13 to ground.

Lastly, if A=1, B=1 both gates 11, 12 are opened. The node 13 will be pulled to ground by the 0 on the lead 12-2 of the opened gate 12, while the 1 on the lead 11-1 is also pulled to the same ground, never "reaching" the node 13.

PHASING MODULE OR PULSE STRETCHER 20

Referring now to FIG. 2a, the building block 10 of FIG. 1 is shown generally with a capacitance or capacitor 15 connected between the output node 13 and ground. The combination of the block 10 and the capacitor 15 is referred to herein as a phasing module or pulse stretcher 20. The operation of the phasing module 20 is depicted in FIG. 2b. It is noted here, and more fully described later, that the capacitor 15 may comprise the distributed capacitance between the FETS 11 and 12 and the gate capacitance of a succeeding FET shown in phantom, at the right of FIG. 2a. Inputs A and B of the block 10 are also inputs A and B for the module 20. A module output 16 applies the capacitor voltage to subsequent circuitry.

Whenever B=1, regardless of the value of A, the node 13 is grounded (a logical 0) as discussed above. Accordingly, if prior to a time when B=1, the capacitor 15 was previously uncharged, it will be discharged. Thus, any time B=1, the output across the capacitor 15 becomes a logical 0 regardless of the previous charge state thereof.

If A=1, B=0, $-V$ (logical 1) is passed through the FET 11 of FIG. 1a to the output node 13, charging the capacitor 15 to $-V$ (logical 1). Subsequently, for any A, B combination where B=0, $-V$ (1) remains on the capacitor 15.

Specifically, if, following the charging of this capacitor 15 to $-V$ (1), A=0 and B32 0, although $-V$ no longer passes through the FET 11, ground is not applied to the node 13 because the FET 12 is closed and $-V$ remains stored on the capacitor 15. If A=1 and B=0 following initial charging of the capacitor 15, its charge remains unchanged.

If A=0, B=0, one of two conditions occurs. If the capacitor 15 are previously uncharged, it remains uncharged; if previously charged (which can occur only when A=1, B=0), it remains charged. Returning to FIG. 1b, this is the meaning of P as the function of A=0, B=0: the capacitor remains in its last previous state, charged or uncharged, as the case may be.

FIG. 2b depicts the state of the capacitor 15 ($V_c$, in volts) for various conditions of A, B. Of particular interest are those A, B combinations following A=1, B=0, the only state which can effect charging of the capacitor 15. It may be seen that A=1, B=0, following any previous A, B combination causes a 1 to be stored in the capacitor 15. A=0, B=1 or A=1, B=1 causes a 0 to be stored in the capacitor 15 regardless of any previous A, B combination. A=0, B=0 causes the state of the capacitor to remain unchanged—1 if the last input was A=1, B =0, 0 if the last input was A=0, B=1, or A=1, B=1.

In FIG. 2B, the ordinate is in volts (0 or −V) and in the logical state represented thereby. All resistive losses have been ignored. The abscissae are time. The asymptotic portions of $V_c$ are due to the non-instantaneous charging and discharging of the capacitor 15.

The function of the module 20 as a pulse stretcher follows from the passive nature of the A=0, B=0 input pair to the module.

Specifically, assume the inputs are A=1, B=0. The capacitor 15 charges down to or remains at −V, i.e., to logical 1. If the following input is A=0, B=0, the −V or 1 pulse stored on the capacitor 15 continues, or, is stretched. The stored 1 pulse will continue to be stretched as long as A=0, B=0. The stored 1 will disappear (−V will discharge to ground) anytime B=1.

Assume now that the inputs are either A=1, B=1 or A=0, B=1. The capacitor discharges up to or remains at 0 volts or logical 0. If the following input is A=0, B=0, the 0 volt or 0 pulse stored on the capacitor 15 continues, or, is stretched for as long as A=0 and B=0.

Referring now to FIG. 2e, the operation of the module 20 with a phased input of a certain type is shown. Inputs $\phi_A$ and $\phi_B$ are clocked inputs applied respectively to the inputs A and B wherein the presence of a signal is a logical 1. Thus, $\phi_A$ is 1 from $t_1$ to $t_2$ and is 0 from $t_2$-$t_5$. $\phi_B$ is 1 from $t_3$-$t_4$, and is 0 for the remainder of a cycle. One cycle is defined as $t_1$ to $t_5$. The cycle repeats at $t_6$. This type of cycle is quite common and is often seen in digital logic circuits. The graph of $V_{16}$ in FIG. 2e omits the asymptotic portions caused by charging and discharging of the capacitor 15. Note how the 1 first occurring at $t_1$-$t_2$ (due to A=1, B=0) has been stretched by the module 20 to persist for a double period $t_1$-$t_3$. The same may be said of the 0 from $t_3$-$t_5$.

A, as the input which is the 1 when the outputs 13 or 16 are 1 is termed, herein, the selected input.

TIMING MODULE 25

Referring now to FIG. 2c the module 20 is shown connected to a NOR-gate 26 to create a timer 25 which performs a hereafter described function. The inputs A, B to the timer 25 are the same inputs to the block 10 and to the module 20. The output 16 of the module 20 is fed to one NOR input. The second NOR input is connected to the non-selected input (here B), i.e., the input which is not 1 when the output 16 is 1, or stated otherwise, the input which always produces a 0 output at 16 when it is a 1. The NOR-gate 26 produces a 1 output only when all of its inputs are 0.

Referring to FIG. 2d, there is shown a truth table depicting the state of the NOR output 27, which is also the timer output, for various inputs. Remembering the discussion above concerning FIGS. 2a and 2b, it is apparent that the NOR or timer output 27 is 0 for A=0, B=1; for A=1, B=0; and for A=1, B=1. Also for the input A=0, B=0 which follows A=1, B=0, the timer output 27 is also 0, because such A, B input, it will be remembered, stretches the 1 at 16 due to the previous A=1, B=0. Accordingly, when A=0, B=0 follows A=1, B=0, the output 27 is 0 because one of the NOR's inputs (from 16) is still a 1.

However, if A=0, B=0 follows either A=0, B=1 or A=1, B=1 (i.e., whenever B=1) the timer output 27 is a 1, because one of its inputs (from B) is 0 and its other input (from 16) is a stretched 0 as previously described.

Referring again to FIG. 2e, assume the two signals $\phi_A$ and $\phi_B$ again have the character shown. A first timer output 27 labelled NOR output 1 results when input A is connected to $\phi_A$ and input B is connected to $\phi_B$ as should be apparent, after noting that the inputs to the NOR-gate are $V_{16}$ (the logical state of the output 16 of the module 20) and $\phi_B$ (or input B). The timer output 27 of interest is a 1 only from $t_4 t_5$, from $t_8$-$t_9$, etc.

If a module 25 were connected so that its B input was connected to $\phi_A$ and its A input to $\phi_B$, the timer output 27 would be as shown and labelled "NOR OUTPUT 2". This timer output 27 is a 1 only from $t_2$-$t_3$, from $t_6$-$t_7$, etc.

FIRST CLOCK EMBODIMENT - FOUR PHASE CLOCK

Figure 3A:
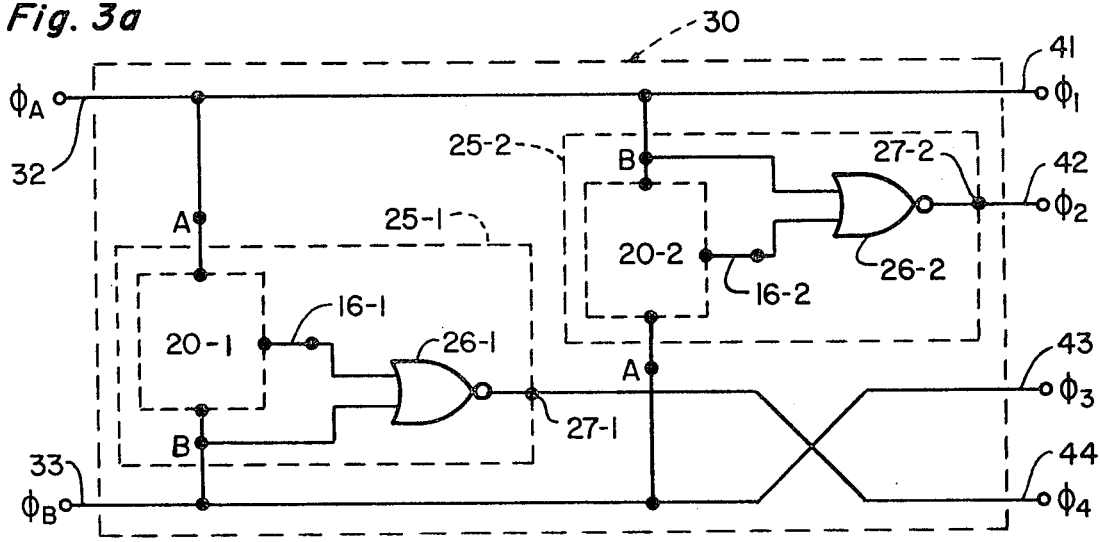
FIG. 3a is a generalized first embodiment of the clock of the present invention utilizing the timer of FIG. 2c.

Referring to FIG. 3a, a four phase clock generator 30 using the elements previously described includes a pair 20-1 and 20-2 of the phasing modules 20 and a pair 26-1 and 26-2 of two-input NOR-gates 26 to create a pair 25-1 and 25-2 of timers 25 which are connected as described below.

Figure 3B:
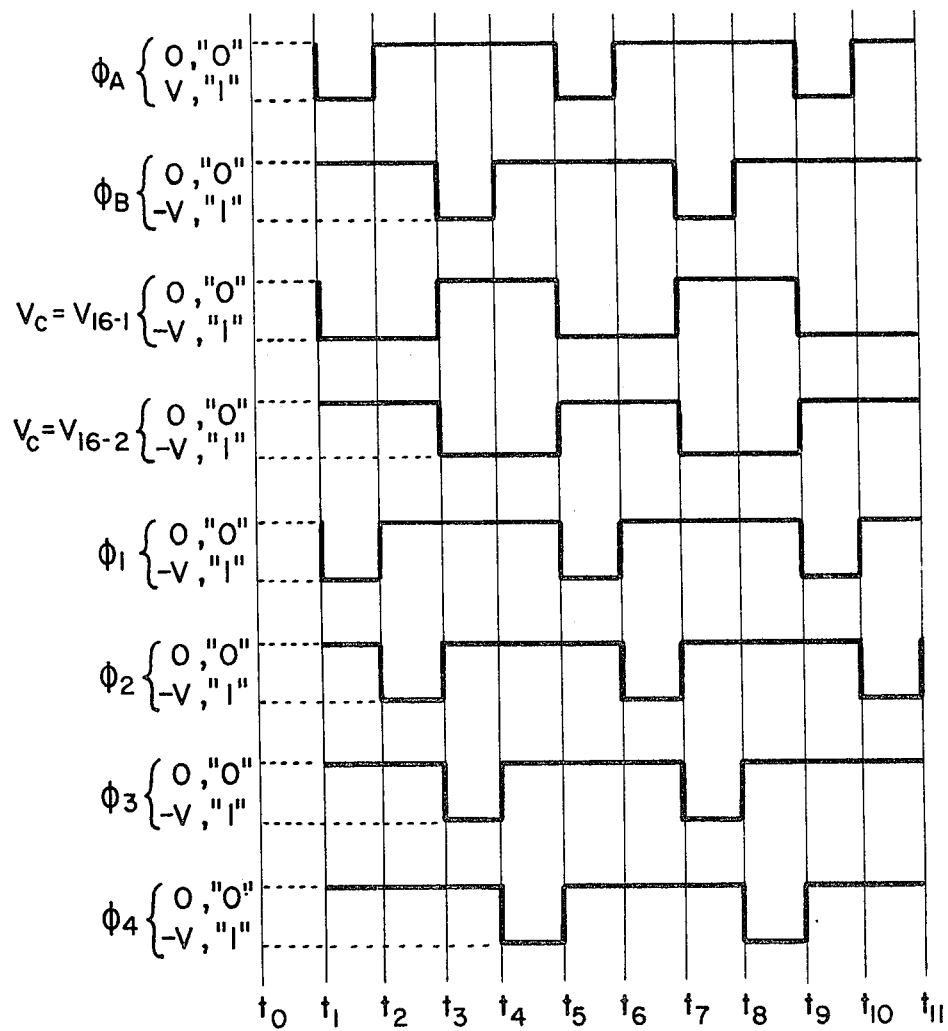

Supplied from outside the clock 30 are the two phased, clock inputs $\phi_A$ and $\phi_B$, which appear in both FIG. 2e and FIG. 3b. Specifically, at some arbitrary time, $t_1$, $\phi_A$ goes from a low voltage state (0 volts or logical 0) to a high negative voltage state (−V or logical 1) which persists from $t_1$ to $t_2$; $\phi_A$ then returns to 0. From $t_2$ to $t_3$; both $\phi_A$ and $\phi_B$ remain at 0. From $t_3$-$t_4$ $\phi_B$ goes from 0 to 1, and then returns to 0. From $t_4$-$t_5$ both $\phi_A$ and $\phi_B$ are at 0. From $t_5$-$t_6$ $\phi_A$ goes from 0 to 1 and the cycle repeats.

The two inputs $\phi_A$ and $\phi_B$ are respectively fed to the clock 30 on two inputs leads 32 and 33. On output leads 41, 42, 43, and 44 will then be present four phased outputs $\phi_1$, $\phi_2$, $\phi_3$, and $\phi_4$ as shown in FIG. 3b.

Specifically $\phi_1$ on the lead 41 goes from 0 to 1 during $t_1$-$t_2$; $\phi_2$ on the lead 42 goes from 0 to 1 during $t_2$-$t_3$; $\phi_3$ on the lead 43 goes from 0 to 1 during $t_3$-$t_4$; and $\phi_4$ on the lead 44 goes from 0 to 1 during $t_4$-$t_5$, at which time the $\phi_1$-$\phi_4$ cycle repeats if $\phi_A$, $\phi_B$ are present, as described above.

Each timer 25 in the clock 30 has A and B inputs which are the same as and operate like those described with reference to FIG. 2c. Whether 0 or 1 is present on the timer output leads 27 depends on the previous analysis made of FIGS. 2a–2e.

The timer 25-1 has its A input connected to the input lead 32 and its B input connected to the input lead 33. The other timer 25-2 is complementarily connected, i.e., A input to the input lead 33 and B input to the input lead 32.

$\phi_1$ appears on the output lead 41, which in this embodiment, is simply a continuation of the input lead 32. Thus, $\phi_1$=$\phi_A$ in magnitude and phase. $\phi_3$ appears on the output lead 43, which in this embodiment is simply a continuation of the input lead 33. Thus, $\phi_3$=$\phi_B$ in magnitude and phase. $\phi_2$ and $\phi_4$ appear respectively on the output leads 42 and 44 which are respective outputs 27-1 and 27-2 of the NOR-gates 26-1 and 26-2, as described immediately below.

Because the inputs $\phi_A$, $\phi_B$ to the clock 30 are phased, certain input combinations to the timers 25 do not occur. For example, because $\phi_A=1$, $\phi_B=1$ does not occur, A=1, B=1 cannot be an input to the timers 25. Moreover, as shown in FIG. 3b, the inputs which do occur, are phased as follows:

|  |  | Timer 25-1 | | Timer 25-2 | |
|---|---|---|---|---|---|
| | $\phi_A$ | $\phi_B$ | A | B | A | B |
| $t_1$-$t_2$ | 1 | 0 | 1 | 0 | 0 | 1 |
| $t_2$-$t_3$ | 0 | 0 | 0 | 0 | 0 | 0 |
| $t_3$-$t_4$ | 0 | 1 | 0 | 1 | 1 | 0 |
| $t_4$-$t_5$ | 0 | 0 | 0 | 0 | 0 | 0 |
| $t_5$-$t_6$ | 1 | 0 | 1 | 0 | 0 | 1 |

Thus, from the previous analysis of FIG. 2, the signals present on the module output leads 16-1 and 16-2 (given as $V_{16-1}$ and $V_{16-2}$ in FIG. 3b) are as follows:

| $t_1$-$t_2$ | 1 | 0 |
| $t_2$-$t_3$ | 1 | 0 |
| $t_3$-$t_4$ | 0 | 1 |
| $t_4$-$t_5$ | 0 | 1 |
| $t_5$-$t_6$ | 1 | 0 |

As described above, the 1 on the lead 16-1 from $t_2$-$t_3$ as well as the 1 on the lead 16-2 from $t_4$-$t_5$ is due to the storage or stretching of the previously generated 1 on the capacitors 15. Such storage, or stretching it will be remembered, results from A=0, B=0 following A=1, B=0.

A NOR-gate yields an output (logical 1) when its inputs are all 0. If any input is 1, the output is 0. If the NOR-gates 26-1 and 26-2 are MOS devices 0 and 1 have the same meaning previously ascribed. Accordingly, the timer outputs 27 from the NOR-gates 26 is described by the following:

| | Inputs to 26-1 | | | Inputs to 26-2 | | |
|---|---|---|---|---|---|---|
| | 16-1 | 33 | Output from 26-1 on 44 | 16-2 | 32 | Output from 26-1 on 42 |
| $t_1$-$t_2$ | 1 | 0 | 0 | 0 | 1 | 0 |
| $t_2$-$t_3$ | 1 | 0 | 0 | 0 | 0 | 1 |
| $t_3$-$t_4$ | 0 | 1 | 0 | 1 | 0 | 0 |
| $t_4$-$t_5$ | 0 | 0 | 1 | 1 | 0 | 0 |
| $t_5$-$t_6$ | 1 | 0 | 0 | 0 | 1 | 0 |

Thus, it may be seen that from $t_2$-$t_3$ a 1 is present on the output 42 which is $\phi_2$. Also, from $t_4$-$t_5$, a 1 is present on the output 44 which is $\phi_4$. Accordingly, there will be present on the output leads 41-44 the four outputs $\phi_1$-$\phi_4$ with the phase relationship shown in FIG. 3b.

SECOND CLOCK EMBODIMENT—ON-CHIP MOS CLOCK

FIG. 4 depicts a preferred embodiment of the clock of the present invention wherein the modules 20 and the timers 25 of the invention as well as the NOR-gates 26 are completely implemented with MOSFETs. Preferably all of the logic elements of the clock 30 are formed simultaneously on the same silicon chip by normal MOS processing sequences.

In FIG. 4a, the clock 30' includes the NOR-gates 26, which each include a pair 60, 61 of MOS devices. One NOR input is the gate lead of the MOS 60; the other input is the gate lead of the MOS 61. One of the controlled terminals of each MOS 60, 61 is interconnected to the corresponding controlled terminal on the other MOS 61, 60 and the terminal pair is grounded. The others of the controlled terminals of the MOS devices 60, 61 are also connected together and to a convenient bias $-V$ through a load 62. This load 62, as well as all other loads 62 so labelled in FIG. 4a, may be a resistor, an MOS device or any other convenient load. If either MOS 60, 61 is opened by a $-V$ or 1 on its gate lead, the $-V$ is coupled trough the load 62 to ground. Only if both gate leads have 0 volts (logical 0) thereon is $-V$ dropped across the load 62 and present on the output leads 42 or 44, which, as can be seen, are respectively connected between the loads 62 and the MOS's 60, 61.

As described earlier, the capacitors 15 in each phasing module 20 may be discrete elements. However, in this preferred embodiment, the capacitors 15 (shown in phantom in FIG. 4a) are the distributed capacitance of the MOS devices 11 and 12 and the insulated gate capacitance of the gate lead of the MOS device 60 in the NOR-gates 26-1 and 26-2.

Figure 4B:
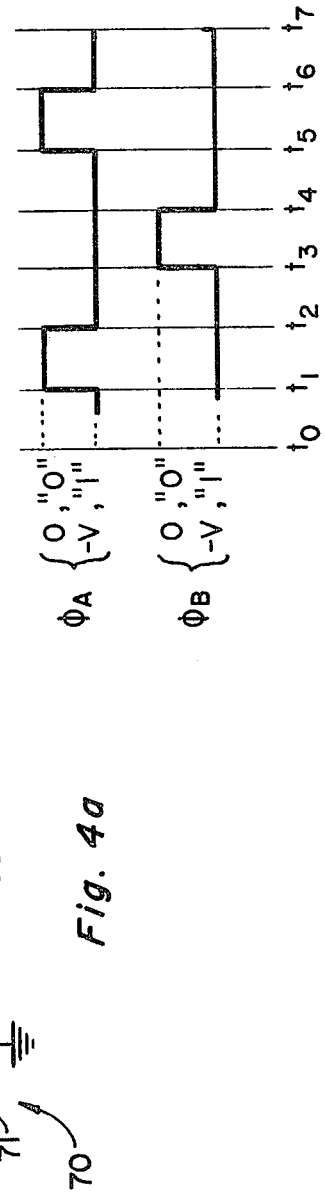
FIG. 4b represents phased inputs to the clock of FIG. 4a which inputs are alternative to those in FIG. 2e and 3b.

The previous description of FIGS. 2c, 2e, and 3b assumed that $\phi_A$ and $\phi_B$ had the configuration shown there. Such is not necessarily the case. Specifically as shown in FIG. 4b, inputs $\phi_A'$ and $\phi_B'$ may comprise a voltage normally at $-V$ (1) which goes momentarily to 0 volts (0) to generate a clock pulse. As shown, then $\phi_A'$ and $\phi_B'$ are inversions of $\phi_A$ and $\phi_B$ as described earlier. Should this be the case, a simple and preferred expedient is to insert between $\phi_A$ and $\phi_B$ on input leads 32 and 33 inverters 70, which may comprise the simple MOS inverter shown or any other type of inverter. Preferred inverters 70 comprise an MOS device 71, the gates of which are respectively connected to $\phi_A$ and $\phi_B$. One controlld terminal of each MOS 71 is grounded, while the other is connected to a convenient $-V$ bias through a load 62, as previously described. The input leads 32 and 33 are respectively connected between the load 62 and the other controlled terminal.

Because many changes and modifications may be made without departing from the spirit and scope of the claims herein, it is intended that all matter in the above specification shall be considered as illustrative only and not in a limiting sense.

What is claimed is:

1. A timer having two inputs and a single output, and utilizing combinations of a first voltage and a second voltage on said inputs to impress a predetermined one or the other of said voltages on said output, wherein the improvement comprises:

a first FET, the gate of which is said one input, and, a first controlled terminal of which is connectible to a source of said first voltage;

a second FET, the gate of which is said other input, a first controlled terminal of which is connected to a source of said second voltage; and, a second controlled terminal of which is connected to a second controlled terminal of said first FET;

a capacitance effectively interposed between said second controlled terminals and a source of said second voltage;

a two input, single output logical element means for providing said first voltage on its output if and only if both of its inputs have said second voltage thereon, and for providing said second voltage on its output for all other states of its inputs;

means for connecting a first of said logical element means inputs to said second controlled terminals; and means for connecting the second of said logical element means inputs to the gate of said second FET.

2. The timer of claim 1 which further comprises
a first pulse source connected to said selected one circuit input, and
a second pulse source connected to said other circuit input,
said pulse sources being of a type wherein
  i. said first pulse source generates said first voltage for a first portion of a cycle ($t_1-t_2$), and said second voltage for the remainder of that cycle ($t_2-t_5$),
  ii. said second pulse source generates said first voltage for an alternate portion of the cycle not coextensive with the first portion of the cycle ($t_3 - t_4$), and said second voltage for the remainder of said cycle ($t_1 - t_3$ and $t_4 - t_5$),
whereby said first voltage is present on said logical element means output only for a a period between the end of the first portion of the cycle and the beginning of the alternate portion of the cycle ($t_2 - t_3$).

3. The timer of claim 2 wherein said logical element means is an FET NOR element comprising:
a third FET the gate of which is said first input of said logical element means, and
a fourth FET the gate of which is said second input of said logical element means,
first controlled terminals of said third and fourth FETs being commonly connected to a source of said first voltage through a load, said output of said logical element means being taken from between said load and said first controlled terminals of said third and fourth FETs,
second controlled terminals of said third and fourth FETs being interconnected and connected to a source of said second voltage.

4. A clock circuit being driven by two pulse sources, a first of which pulse sources generates a first voltage for a first portion of a cycle ($t_1 - t_2$) and a second voltage for the remainder of the cycle ($t_2 - t_5$), a second of which pulse sources generates said first voltage for a second portion of the cycle ($t_3 - t_4$) and said second voltage for the remainder of the cycle ($t_1 - t_3$ and $t_4 - t_5$), said clock comprising:
first timer having two inputs and a single output, and utilizing combinations of the first voltage and the second voltage on said inputs to impress a predetermined one or the other of said voltages on said output, and comprising:
  a first FET, the gate of which is said one input, and, a first controlled terminal of which is connectible to a source of said first voltage;
  a second FET, the gate of which is said other input, a first controlled terminal of which is connectible to a source of said second voltage, and, a second controlled terminal of which is connected to a second controlled terminal of said first FET;
  a capacitance effectively interposed between said second controlled terminals and a source of said second voltage;
  a two input, single output logical element means for providing said first voltage on its output if and only if both of its inputs have said second voltage thereon, and for providing said second voltage on its output for all other states of its inputs;
  means for connecting a first of said logical element means inputs; and
  means for connecting the second of said logical element means inputs;
a second timer having two inputs and a single output, and utilizing combinations of the first voltage and the second voltage on said inputs to impress a predetermined one or the other of said voltages on said output, and comprising:
  a first FET, the gate of which is one input, and, a first controlled terminal of which is connectible to a source of said first voltage;
  a second FET, the gate of which is said other input, a first controlled terminal of which is connectible to a source of said second voltage, and, a second controlled terminal of which is connected to a second controlled terminal of said first FET;
  a capacitance effectively interposed between said second controlled terminals and a source of said second voltage;
  a two input, single output logical element means for providing said first voltage on its output if and only if both of its inputs have said second voltage thereon, and for providing said second voltage on its output for all other states of its inputs;
  means for connecting a first of said logical element means inputs;
  means for connecting the second of said logical element means inputs;
means for connecting said first pulse source both to the gate of said first FET in said first timer and to the gate of said second FET in said second timer;
means for connecting said second pulse source to the gate of said second FET in said first timer and to the gate of said first FET in said second timer;
first clock output means connected to said first FET gate in said first timer;
second clock output means connected to said output of said logical element means in said second module;
third clock output means connected to said first FET gate in said second module; and
fourth clock output means connected to said output of said logical element means in said first module,
said first voltage being present on
  i. said first clock output means for the first portion of the cycle ($t_1 - t_2$),
  ii. said second clock output means for a portion between the end of the first portion of the cycle and the beginning of the second portion of the cycle ($t_2 - t_3$),
  iii. said third clock output means for the second portion of the cycle ($t_3 - t_4$),
  iv. said fourth clock output means for the remainder of the cycle ($t_4 - t_5$).

5. The clock circuit of claim 4 wherein said logical element means in each timer, respectively, is in FET NOR element comprising:
a third FET the gate of which is said first input of said logical element means, and
a fourth FET the gate of which is said second input of said logical element means input,
first controlled terminals of said third and fourth FETs being commonly connected to a source of said first voltage through a load, said outut of said logical element means being taken from between said load and said first controlled terminals of said third and fourth FETS, second controlled terminals of said third and fourth FETs being interconnected and connected to a source of said second voltage.

6. The clock circuit of claim 5 wherein all of said FETs are formed on the same chip and wherein said capacitance includes the distributed capacitance of said first and second FETs in each timer plus the insulated gate capacitance of said third FET in each timer.

7. The clock circuit of claim 6 wherein two inverters are respectively interposed between said first pulse generator and said first FET gate in said first timer, and between said second pulse generator and said first FET gate in said second timer.

8. The clock circuit of claim 7 wherein said inverters are FETs and wherein said pulse generators are respectively connected to the gates of said inverters FETs, one controlled terminal of each inverter FET is connected to a source of said second voltage, and the other controlled terminal of each inverter FET is connected through a load to a source of said first voltage, the gate of the first FET in each of said timers being respectively connected between said load and said other controlled terminal of said inverter FETs.

9. The clock circuit of claim 8, wherein said inverter FETs are formed on said chip, said FETs are p-channel types using negative logic, said first voltage is −V, and said second voltage is 0 volts.

10. A logical subcircuit comprising:
a. a plurality of circuit inputs;
b. a single circuit output; and, connected between said inputs and said output,
c. gate means for
i. impressing a first logical value on said circuit output when only a selected one of said circuit inputs has said first logical value thereon,
ii. impressing said second logical value on said circuit output when any of said other circuit inputs has said first logical value thereon,
iii. maintaining the last succeeding logical value of said circuit output if all of said circuit inputs have said second logical value thereon;
d. a NOR element having a single output and a pair of inputs, one NOR input being connected to said circuit output, the other NOR input being connected to a circuit input other than said selected circuit input, said NOR output having said first logical value thereon only if said circuit inputs have said second logical value thereon and the last succeeding value of said circuit output was not said first logical value.

11. A logical system which includes a plurality of system inputs and a corresponding number of the logical subsystems of claim 10, each circuit of each subsystem having inputs equal in number of the number of system inputs, which system further comprises:
e. means for connecting the selected circuit input of each subsystem respectively to one of the system inputs; and
f. means for connecting said other circuit inputs, respectively, to the other of said system inputs.

12. A logical system as set forth in claim 11 which further includes:
g. a first set of system outputs connected respectively to each system input, and
h. a second set of system outputs connected respectively to each NOR output.

13. A clock circuit comprising:
A. a first logical subcircuit having:
a. a plurality of circuit inputs;
b. a single circuit output; and, connected between said inputs and said output,
c. gate means for
i. impressing a first logical value on said circuit output when only a selected one of said circuit inputs has said first logical value thereon,
ii. impressing said second logical value on said circuit output when any of said other circuit inputs has said fist logical value thereon,
iii. maintaining the last succeeding logical value of said circuit output if all of said circuit inputs have said second logical value thereon;
d. a NOR element having a single output and a pair of inputs, one NOR input being connected to said circuit output, the other NOR input being connected to a circuit input other than said selected circuit input, said NOR output having said first logical value thereon only if said circuit inputs have said second logical value thereon and the last succeeding value of said circuit output was not said first logical value;
B. a second logical circuit having:
a. a plurality of circuit inputs;
b. a single circuit output; and, connected between said inputs and said output,
c. gate means for
i. impressing the first logical value on said circuit output when only a selected one of said circuit inputs has said first logical value thereon,
ii. impressing said second logical value on said circuit output when any of said other circuit inputs has said first logical value thereon,
iii. maintaining the last succeeding logical value of said circuit output if all of said circuit inputs have said second logical value thereon;
d. a NOR element having a single output and a pair of inputs, one NOR input being connected to said circuit output, the other NOR input being connected to a selected circuit input other than said selected circuit input, said NOR output having said first logical value thereon only if said circuit inputs have said second logical value thereon and the last succeeding value of said circuit output was not said first logical value;
C. means for connecting said selected one of said circuit inputs of said first logical subcircuit to at least one of said other circuit inputs of said second logical subcircuit;
D. means for connecting said selected one of said circuit inputs of said second logical subcircuit to at least one of said other circuit inputs of said first logical subcircuit;
E. means for providing said first logical value on a first system input for a first portion ($t_1$ to $t_2$) of a cycle, and for providing said second logical value on said first system input for the remainder ($t_2$ to $t_3$, from $t_3$ to $t_4$, and from $t_4$ to $t_5$) of the cycle other than the first portion; and
F. means for providing said fist logical value on a second system input for a second portion ($t_3$ to $t_4$) of the cycle separate from the first portion of the cycle and for providing said second logical value on said second system input for the remainder ($t_1$ to $t_2$, from $t_2$ to $t_3$ and from $t_4$ to $t_5$) of the cycle other than the second portion.

14. A timer comprising:
a. a pair of inputs,
b. an output, and
c. gate means connected between said inputs and said output for
   i. impressing a first logical value on said output when only a first of said inputs has said first logical value thereon coincident with the second input having a second logical value thereon,
   ii. impressing said second logical value on said output when said second input has said first logical value therein, and
   iii. permitting to remain the last succeeding logical value of said output when both inputs have said second logical value thereon;
d. a two-input NOR-gate for producing at an output thereof
   i. said first logical value in response to the presence at both NOR inputs of said second logical value and
   ii. said second logical value in response to any other combination of values of both NOR inputs;
means for connecting one NOR input to said circuit output; and the other NOR input to said second input of said circuit;
means for connecting said NOR output having said first logical value thereon if and only if both circuit inputs have said second logical value thereon and the last succeeding value of said circuit output was not said first logical value.

15. A clock comprising:
a first timer having:
a. a pair of inputs,
b. an output, and
c. gate means connected between said inputs and said output for
   i. impressing a first logical value on said output when only a first of said inputs has said first logical value thereon coincident with the second input having a second logical value thereon,
   ii. impressing said second logical value on said output when said second input has said first logical value thereon, and
   iii. permitting to remain the last succeeding logical value of said output when both inputs have said second logical value thereon;
d. a two-input NOR-gate for producing at an output thereof
   i. said first logical value in response to the presence at both NOR inputs of said second logical value and
   ii. said second logical value in response to any other combination of values of both NOR inputs;
means for connecting one NOR input to said circuit output; and the other NOR input to said second input of said circuit;
means for connecting said NOR output having said first logical value thereon if and only if both circuit inputs have said second logical value thereon and the last succeeding value of said circuit output was not said first logical value;
a second timer having:
a. a pair of inputs,
b. an output, and
c. gate means connected between said inputs and said output for
   i. impressing a first logical value on said output when only a first of said inputs has said first logical value thereon coincident with the second input having a second logical value thereon,
   ii. impressing said second logical value on said output when said second input has said first logical value thereon, and
   iii. permitting to remain the last succeeding logical value of said output when both inputs have said second logical value thereon;
d. a two-input NOR-gate for producing at an output thereof
   i. said first logical value in response to the presence at both NOR inputs of said second logical value and
   ii. said second logical value in response to any other combination of values of both NOR inputs;
means for connecting one NOR input to said circuit output; and the other NOR input to said second input of said circuit;
means for connecting said NOR output having said first logical value thereon if and only if both circuit inputs have said second logical value thereon and the last succeeding value of said circuit output was not said first logical value;
first output means connected to said first input of the first timer;
second output means connected to said output of said NOR-gate of the second timer;
third output means connected to said first input of said second timer;
fourth output means connected to said output of said NOR-gate of said first timer;
first intermittent train of said logical values applied to said first input of said first timer and to said second input of said second timer; and
a second intermittent train of said logical values applied to said second input of said first timer and to said first input of said second timer.

16. The clock of claim 15 wherein the trains are phased so that the occurrence of said first logical value in one of said trains is followed first by said second logical value in both trains and then by said first logical value in the other train.

* * * * *